(12) United States Patent
Guo

(10) Patent No.: US 12,263,574 B2
(45) Date of Patent: Apr. 1, 2025

(54) MANIPULATOR

(71) Applicant: BEIJING NAURA MICROELECTRONICS EQUIPMENT CO., LTD., Beijing (CN)

(72) Inventor: Hao Guo, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 144 days.

(21) Appl. No.: 18/044,866

(22) PCT Filed: Aug. 30, 2021

(86) PCT No.: PCT/CN2021/115292
§ 371 (c)(1),
(2) Date: Mar. 10, 2023

(87) PCT Pub. No.: WO2022/052827
PCT Pub. Date: Mar. 17, 2022

(65) Prior Publication Data
US 2023/0330864 A1 Oct. 19, 2023

(30) Foreign Application Priority Data
Sep. 11, 2020 (CN) .......................... 202010952374.9

(51) Int. Cl.
*B25J 11/00* (2006.01)
*B25J 15/00* (2006.01)
*H01L 21/687* (2006.01)

(52) U.S. Cl.
CPC ....... *B25J 11/0095* (2013.01); *B25J 15/0014* (2013.01); *H01L 21/68707* (2013.01)

(58) Field of Classification Search
CPC ......... H01L 21/67742; H01L 21/67766; H01L 21/67778; H01L 21/683; H01L 21/68707;
(Continued)

(56) References Cited

U.S. PATENT DOCUMENTS

| 6,293,749 B1 | 9/2001 | Raaijmakers et al. |
| 7,048,316 B1* | 5/2006 | Blank ............... H01L 21/68707 294/902 |

(Continued)

FOREIGN PATENT DOCUMENTS

| CN | 106601656 A | 4/2017 |
| CN | 106783715 A | 5/2017 |

(Continued)

OTHER PUBLICATIONS

The European Patent Office (EPO) The Extended European Search Report for Application No. 21865883.9 Sep. 23, 2024 8 Pages.

*Primary Examiner* — Glenn F Myers
(74) *Attorney, Agent, or Firm* — ANOVA LAW GROUP, PLLC

(57) ABSTRACT

The manipulator of embodiments of the present disclosure is configured to transfer a wafer and includes a finger structure and a plurality of support members. The plurality of support members are arranged at the finger structure and distributed at intervals on a same circumference. Each support member is configured to contact an edge of the wafer to support the wafer to prevent the wafer from contacting the finger structure. With the manipulator of embodiments of the present disclosure, the wafer is prevented from contacting the finger structure to avoid scratches and contact marks generated at the surface of the wafer.

14 Claims, 5 Drawing Sheets

(58) Field of Classification Search
CPC .. B25J 15/0019; B25J 15/009; B25J 15/0095; B25J 15/0014
See application file for complete search history.

(56) References Cited

U.S. PATENT DOCUMENTS

| | | | |
|---|---|---|---|
| 7,104,578 B2 | 9/2006 | Hartog | |
| 9,919,430 B1* | 3/2018 | Bosboom | .......... H01L 21/68707 |
| 2007/0022588 A1 | 2/2007 | Kent | |
| 2014/0110959 A1* | 4/2014 | Urabe | ............... H01L 21/68707 |
| | | | 901/31 |
| 2020/0176299 A1 | 6/2020 | Chang et al. | |
| 2021/0202291 A1* | 7/2021 | Yoshida | ............ H01L 21/68707 |

FOREIGN PATENT DOCUMENTS

| | | |
|---|---|---|
| CN | 208923074 U | 5/2019 |
| CN | 209658147 U | 11/2019 |
| CN | 111319047 A | 6/2020 |
| CN | 211907410 U | 11/2020 |
| CN | 112018024 A | 12/2020 |
| CN | 113113340 A | 7/2021 |
| JP | 2003168717 A | 6/2003 |
| JP | 2017143179 A | 8/2017 |

\* cited by examiner

MANIPULATOR

CROSS-REFERENCE TO RELATED APPLICATIONS

This application is a national phase entry under 35 U.S.C. § 371 of International Application No. PCT/CN2021/115292, filed on Aug. 30, 2021, which claims priority to Chinese Application No. 202010952374.9 filed on Sep. 11, 2020, the entire contents of both of which are incorporated herein by reference.

TECHNICAL FIELD

The present disclosure generally relates to the semiconductor processing technology field and, more particularly, to a manipulator.

BACKGROUND

Currently, in a process of performing a semiconductor process, a wafer needs to be gradually transferred from an atmospheric environment to a process chamber for performing process processing. In this process, the transfer of the wafer needs to be implemented by using a transfer module consisting of a series of an atmosphere apparatus and a vacuum apparatus. The transfer module usually includes a manipulator, which transfers the wafer through movements such as retraction and lifting.

For some processes that process a back surface of the wafer, such as the back metal process, which deposits aluminum (Al), titanium (Ti), nickel (Ni), silver (Ag), and other metals on the back surface of the wafer. In this process, the wafer needs to be introduced into the process chamber with the back surface facing up and a front surface facing down for processing. However, the existing manipulator will contact the surface of the wafer during the process of transferring the wafer. For the wafer facing down, it is easy to cause scratches or contact marks to be formed on the front surface of the wafer. The wafer with the back-metal process tends to curl up greatly, which will increase a contact area between the wafer and the manipulator. Thus, the scratches on the front surface of the wafer become more severe, which negatively impacts the subsequence processes and greatly reduces the yield of the products.

SUMMARY

Embodiments of the present disclosure provide a manipulator for the existing disadvantage. With the manipulator, the wafer can be prevented from contacting the finger structure to avoid scratches and contact marks generated on a surface of the wafer.

Embodiments of the present disclosure provide a manipulator configured to transfer a wafer. The manipulator includes a finger structure and a plurality of support members. The plurality of the support members are arranged at the finger structure and distributed at intervals on a same circumference. Each support member is configured to contact an edge of the wafer to support the wafer to prevent the wafer from contacting the finger structure.

In some embodiments, each support member includes a support surface for supporting the wafer. The support surface is an inclined surface inclined relative to a horizontal plane. A height of the inclined surface relative to the horizontal plane gradually increases in a radial direction of the circumference along a direction away from a center of the circumference.

In some embodiments, the inclined surface is a plane and has an angle with the horizontal plane ranging from 1° to 60°.

In some embodiments, the angle is 5.75°.

In some embodiments, each support member includes a support body and an anti-slip flexible member arranged at the support body. The support surface is formed at the anti-slip flexible member.

In some embodiments, the anti-slip flexible member is annular. A cross-section shape of the anti-slip flexible member satisfies a point contact between the support surface and the wafer.

In some embodiments, an installation groove is formed at the support body, a part of the anti-slip flexible member is arranged inside the installation groove, and another part is arranged outside the installation groove.

In some embodiments, at least one marking line is provided on the support surface of each supporting member, and each marking line is used to indicate a position of the edge of the wafer of a size on the support surface.

In some embodiments, the finger structure includes two fingers arranged at an interval in a direction parallel to the horizontal plane. The interval between the two fingers is set to prevent the wafer from contacting the fingers.

In some embodiments, the manipulator further includes a positioning member and a fastener. The positioning member is arranged at the finger structure and configured to limit a position of the support member at the finger structure. The fastener is configured to fixedly connect the support member to the finger structure.

The beneficial effects of embodiments of the present disclosure are as follows.

The manipulator of embodiments of the present disclosure is provided with the plurality of support members arranged on the same circumference on the finger structure at intervals. Each support member is configured to contact the edge of the wafer to support the wafer to prevent the wafer from contacting the finger structure. Since the plurality of support members only contact the edge of the wafer. Thus, the support member is prevented from contacting the surface of the wafer when the wafer is ensured to be supported. The scratches and contact marks generated on the surface of the wafer due to the contact between the manipulator and the surface of the wafer can be prevented. Meanwhile, the plurality of support members can also be configured to prevent the wafer from contacting the finger structure to reduce the scratches generated by the contract friction of the finger structure caused by the curled wafer to a certain degree. Thus, with the manipulator of embodiments of the present disclosure, the scratches generated on the surface of the wafer can be reduced to impact the subsequent processes. The yield of the product can be improved. Thus, the manipulator can be applied to the processes of the semiconductor processing apparatus that require the protection of the surface of the wafer, e.g., the back metal process.

BRIEF DESCRIPTION OF THE DRAWINGS

The above and/or additional aspects and advantages of the present disclosure will become apparent and easy to understand from the following description of the embodiments in connection with the accompanying drawings.

DETAILED DESCRIPTION OF THE EMBODIMENTS

Figure 1A:
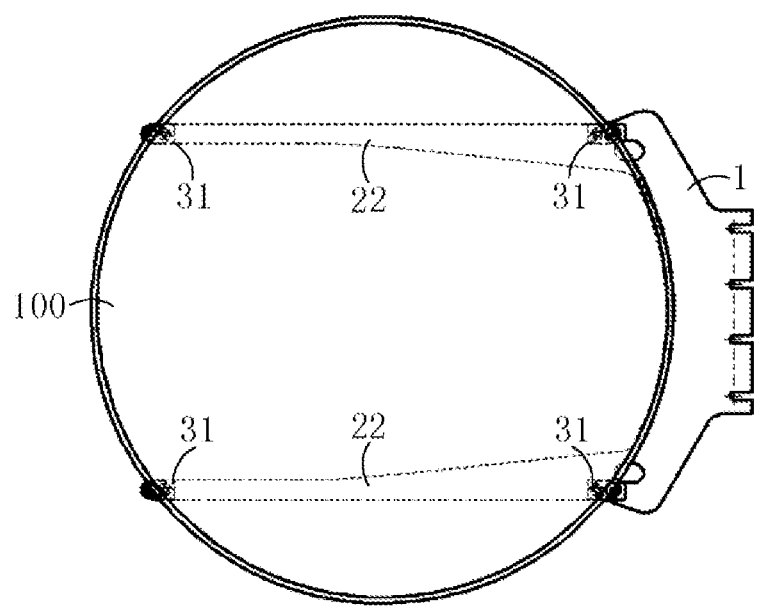
FIG. 1A illustrates a schematic top view of a manipulator when supporting a wafer according to some embodiments of the present disclosure.

Embodiments of the present disclosure are described in detail below. Embodiments of the present disclosure are shown in the accompanying drawings. The same or similar reference numerals represent the same or similar components or components with the same or similar functions throughout. Furthermore, detailed descriptions of the known techniques are omitted if the descriptions are not necessary to illustrate features of embodiments of the present disclosure. The embodiments described below by referring to the accompanying drawings are exemplary only for explaining the present disclosure and should not be considered as limiting the present disclosure.

Those skilled in the art can understand that, unless otherwise specified, all terms (including technical terms and scientific terms) used here have the same meanings as commonly understood by those of ordinary skill in the art. It should also be understood that terms, such as those defined in commonly used dictionaries, should be understood to have meanings consistent with the meaning in the context of the prior art, and unless specifically specified here, otherwise the terms will not be explained with idealized or overly formal meaning.

The technical solutions of the present disclosure and how the technical solutions of the present disclosure solve the above technical problems are described in detail below with specific embodiments.

Figure 1B:
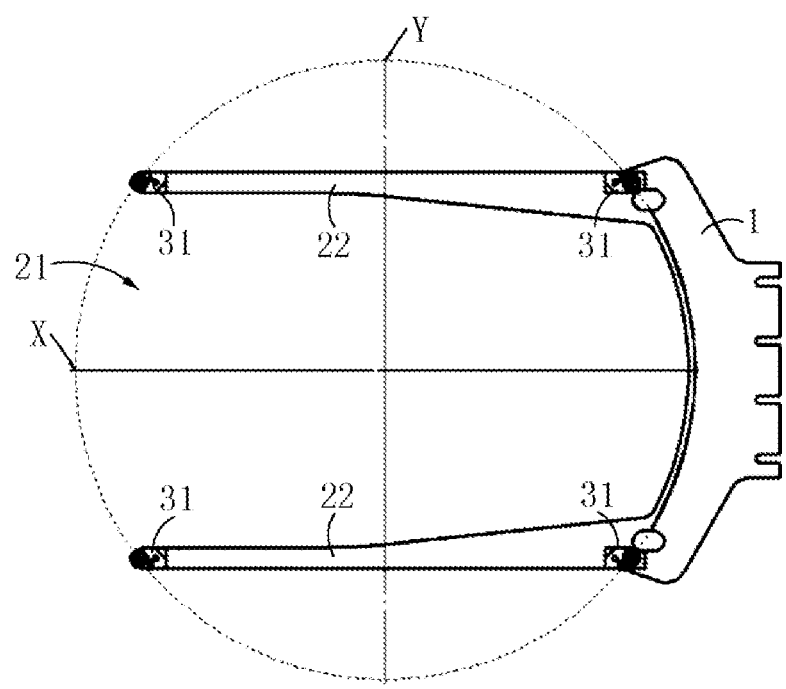
FIG. 1B illustrates a schematic top view of a manipulator and a wafer position according to some embodiments of the present disclosure.
Figure 1C:
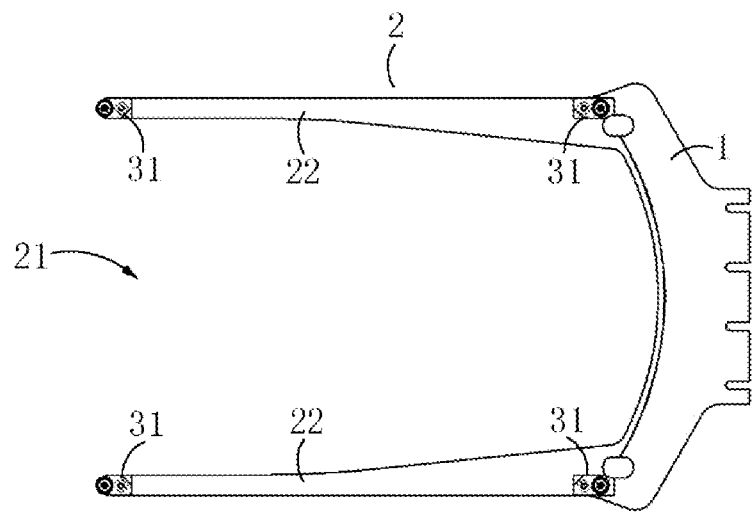
FIG. 1C illustrates a schematic top view of a manipulator according to some embodiments of the present disclosure.

Embodiments of the present disclosure provide a manipulator configured to transfer a wafer. As shown in FIG. 1A to FIG. 1C, the manipulator includes a finger structure 2. The finger structure 2 can be connected to an arm 1 of the manipulator and arranged on a side of the arm 1 of the manipulator to form a cantilever structure. The finger structure 2 can be driven by the arm 1 of the manipulator to retract, extend, ascend, and descend to transfer a wafer 100. The arm 1 of the manipulator and the finger structure 2 can be made of metal materials or ceramics or quartz materials. In addition, the finger structure 2 and the arm 1 of the manipulator can be formed in an integral structure or separate structures.

The finger structure 2 can have a plurality of structures. For example, in embodiments of the present disclosure, the finger structure 2 can include two fingers 22. An interval between the two fingers 22 can form a hollow member 21. With the hollow member 21, the finger 22 can be further prevented from contacting the wafer 100. Especially for a curled wafer, a center area can curl toward a side close to the finger 22 relative to an edge area. That is, the center of the wafer can be recessed downward, and the edge can curl upward. For this situation, by forming the hollow member 21 between the two fingers 22, the center member of the wafer that is recessed downward can be avoided. Thus, the finger 22 can be prevented from contacting the surface of the wafer 100 to further reduce the scratches generated by the contact friction between the wafer 100 and the finger 22.

In some optional embodiments, a value of the interval between the two fingers 22 can range from 100 mm to 290 mm, in some embodiments, can be 120 mm, 150 mm, 180 mm, 182 mm, 200 mm, 240 mm, or 280 mm. In practical applications, a corresponding value can be selected according to different specifications of the wafer 100. In some embodiments, when the diameter of the wafer 100 is larger, the value of the interval is larger, otherwise, the value is smaller.

It should be noted that in practical applications, the finger structure 2 can also adopt any other structure, for example, an annular structure that can form the above hollow member 21 or a recess member arranged at the finger structure 2 that can avoid the center member of the wafer that is recessed downward. Thus, the contact between the finger 22 and the surface of the wafer 100 can be avoided.

The above manipulator also includes a plurality of support members 31. For example, four support members 31 are shown in FIG. 1A to FIG. 1C. Of course, in practical applications, three, five, or more support members 31 can be provided, as long as the wafer 100 can be uniformly and stably supported.

The plurality of support members 31 can be arranged at the finger structure 2 and distributed at intervals along a same circumferential direction. A plane where the circumferential direction is located can be, for example, parallel to a horizontal plane. Moreover, each support member 31 can be configured to contact the edge of the wafer 100 to support the wafer 100. Since the plurality of support members 31 only contact the edge of the wafer 100, the contact with the surface of the wafer can be avoided, and the wafer can be stably supported. Thus, the scratches and the contact mark generated by the contact between the manipulator and the surface of the wafer can be avoided. Meanwhile, the plurality of support members 31 can be further configured to avoid the contact between the wafer and the finger structure 2. Thus, the scratches generated by the contact friction with the finger structure 2 caused by the curl of the wafer can be reduced to a certain degree.

Therefore, with the manipulator of embodiments of the present disclosure, the impact on the subsequent processes caused by the scratches on the surface of the wafer can be reduced to improve the yield of the product. Thus, the manipulator can be applied to the semiconductor process apparatus that requires a process of protecting the surface of the wafer, e.g., the back metal process.

It should be noted that, based on the plurality of support members 31 above, the finger structure 2 can also adopt a flat plate structure. That is, the above hollow member 21 may be not provided, and only the plurality of support members 31 can be configured to avoid the contact between the finger structure 2 and the surface of the wafer 100.

Figure 2A:
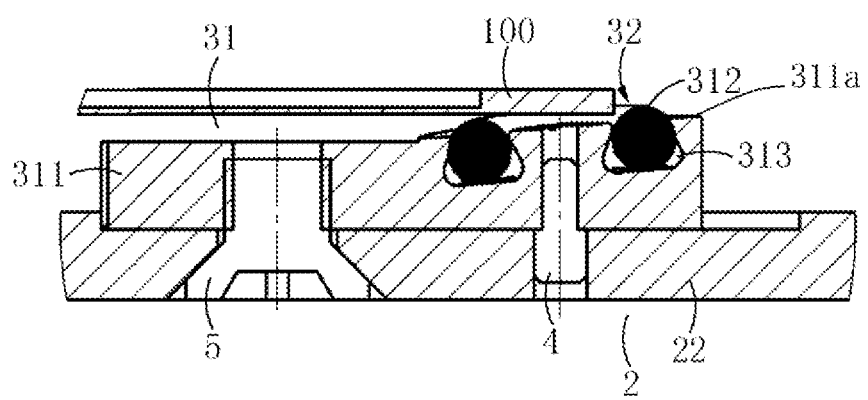
FIG. 2A illustrates a schematic partial sectional view of a manipulator according to some embodiments of the present disclosure.
Figure 2B:
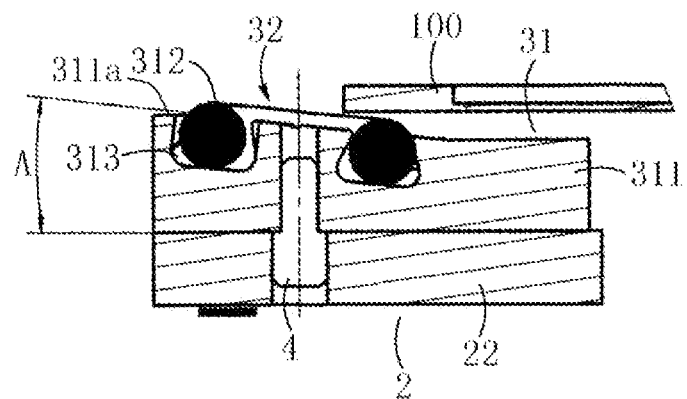
FIG. 2B illustrates another schematic local sectional view of a manipulator according to some embodiments of the present disclosure.

In some optional embodiments, as shown in FIG. 2A and FIG. 2B, each support member 31 includes a support surface 32 for supporting the wafer 100. The support surface 32 can be an inclined surface inclined relative to the horizontal plane. A height of the inclined surface relative to the horizontal plane can increase gradually in a radial direction of the circumference where the support member 31 is located along a direction away from the center of the circumference. That is, the plurality of support members 31 can form a recess member on inner sides of the plurality of support members 31. The support surfaces 32 of the plurality of support members 31 can form a side surface of the recess member. The side surface can be a cone-shaped annular surface that is non-continuous in the circumferential direction. The edge of the wafer 100 can contact the cone-shaped annular surface to support the wafer 100. Moreover, a size of an opening of the cone-shaped annular surface can gradually increase along a direction away from a bottom of the recess member. With such a setting, the support surfaces 32 can be ensured to only contact the edge of the wafer and not contact the surface of the wafer 100. The position of the wafer can be automatically corrected by the gravity of the wafer 100. The contact positions between the edge of the wafer 100 and the support surfaces 32 can also be ensured to be at a same height to ensure that the wafer 100 can be placed horizontally.

In some optional embodiments, as shown in FIG. 1B, two support surfaces 32 on a side of an X-axis are arranged symmetrically with two support surfaces 32 on the other side of the X-axis. Two support surfaces 32 on a side of a Y-axis are arranged symmetrically with two support surfaces 32 on the other side of the Y axis. Thus, the contact positions between the four support members 31 and the wafer 100 can be distributed more evenly to improve the support stability.

In some optional embodiments, as shown in FIG. 2A and FIG. 2B, each support member 31 includes a support body 311 and an anti-slip flexible member 312 arranged at the support body 311. The above support body 311 can be made of a metal or non-metal material to ensure rigidity required for supporting the wafer. For example, the support body 311 can be made of a material such as stainless steel, aluminum, quartz, or ceramics, which is not limited by embodiments of the present disclosure. With the setting of the above support body 311, and distance between the wafer 100 and the finger structure 2 can be increased to further prevent the wafer 100 from contacting the finger structure 2. Especially for the curled wafer, the increased distance can be used to more easily realize the non-contact between the wafer 100 and the finger structure 2. In practical applications, the shape and size of the support body 311 can be freely set according to specific needs, as long as the wafer can be ensured to be not in contact with the finger structure 2.

The above support surface 32 can be formed at the anti-slip flexible member 312. That is, the anti-slip flexible member 312 can contact the edge of the wafer 100 to support the wafer 100. Meanwhile, the anti-flexible member 312 can be configured to increase the contact friction with edge of the wafer to prevent the wafer from slipping. The anti-slip flexible member 312 can be made of an anti-slip material such as silica gel or rubber with a relatively large friction coefficient, which is not limited by embodiments of the present disclosure.

The anti-slip flexible member 312 can have a plurality of structures. For example, the anti-slip flexible member 312 can be annular. A cross-sectional shape of the anti-slip flexible member 312 can satisfy a point contact between the support surface 32 and the wafer. The cross-sectional shape can be, for example, circular, oval, etc. Since the anti-slip flexible member 312 is annular, at most two contact points (i.e., an intersection of the wafer edge and the annular anti-slip flexible member 312) can be provided, which greatly reduces a contact area between the anti-slip flexible member 312 and the wafer to further reduce possibility of scratches generated at the wafer. The above anti-slip flexible member 312 can be, e.g., a sealing ring, whose material is easy to obtain, and which can effectively reduce application and maintenance costs.

It should be noted that embodiments of the present disclosure are not limited to the use of the annular anti-slip flexible member 312. In addition, the anti-slip flexible member 312 can also adopt any other shape, as long as the anti-slip flexible member 312 can support the wafer and prevent the wafer from slipping.

In some optional embodiments, as shown in FIG. 2A and FIG. 2B, an installation groove 313 is formed at the support body 311. A part of the anti-slip flexible member 312 can be arranged inside the installation groove 313. Another part can be arranged outside the installation groove 313 to fix the anti-slip flexible member 312 at the supporting body 311. In some embodiments, for the annular anti-slip flexible member 312, the installation groove 313 can be correspondingly configured as an annular recess groove. Of course, according to the anti-slip flexible members 312 with different shapes, the shape of the installation groove 313 can be adaptively adjusted. Optionally, to prevent the anti-slip flexible member 312 from falling off from the installation groove 313. The installation groove 313 can be a "dovetail groove" or another recess groove having an opening with a relatively small size.

It should be noted that embodiments of the present disclosure do not limit an installation method of the anti-slip flexible member 312. For example, the anti-slip flexible member 312 can also be directly glued to the support body 311, which is not limited by embodiments of the present disclosure. Those skilled in the art can perform adjustments according to the actual situation.

In some optional embodiments, the support surface 32 can be caused to form the inclined surface in a plurality of manners. For example, as shown in FIG. 2A and FIG. 2B, an inclined surface 311a is formed at the support body 311. The installation groove 313 formed on the inclined surface 311a can be also inclined. Thus, when the anti-slip flexible member 312 is installed in the installation groove 313, the anti-slip flexible member 312 can be also inclined to form the support surface 32 of the anti-slip flexible member 312 into the inclined surface. As shown in FIG. 2B, by taking that the bottom surface of the support body 311 is parallel with the horizontal surface, and the support surface 32 is parallel with the inclined surface 311a of the support body 311 as an example, the inclined surface 311a is a plane and has an angle A with the bottom surface of the support body 311, that is, equal to an angle between the support surface 32 and the horizontal plane. The angle A can be 1° to −60°, for example, 5.75°. With such a setting, the wafer can be ensured to be stably supported to prevent the wafer from slipping. The processing difficulty and cost of the support body 311 can be reduced. In practical applications, a specific value of the angle A can be 1°, 15°, 28°, 35°, 45°, 50°, or 55°. The size of the angle A can be freely selected according to wafers with different specifications.

It should be noted that, in some embodiments, the inclined surface 311a can be a plane. However, the present disclosure is not limited to this. In practical applications, the above inclined surface 311a can also be an arc-shaped convex surface or an inclined surface any other shapes, which is not limited by embodiments of the present disclosure. Those skilled in the art can perform adjustments according to actual situations.

Figure 3A:
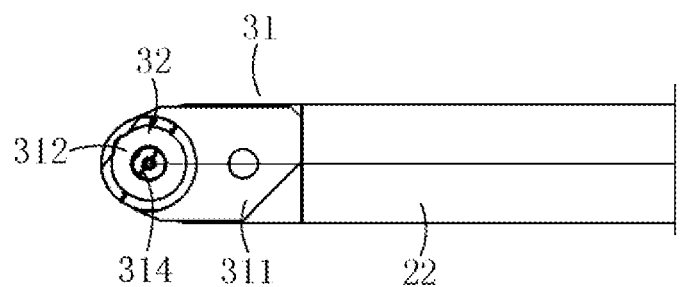
FIG. 3A illustrates a schematic partially enlarged view of a finger structure according to some embodiments of the present disclosure.
Figure 3B:
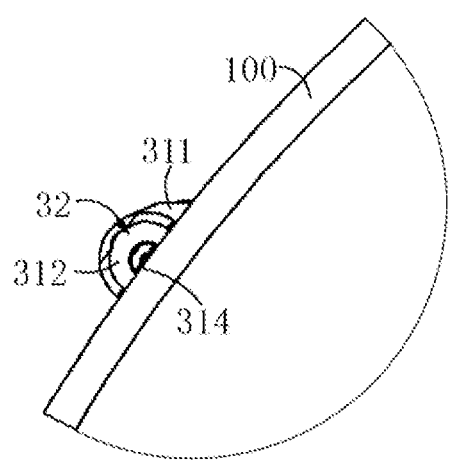
FIG. 3B illustrates a schematic partial enlarged view showing using a support member to cooperate with an edge of the wafer according to some embodiments of the present disclosure.

In some optional embodiments, as shown in FIG. 3A and FIG. 3B, at least one marking line 314 is provided on the support surface 32 of each support member 31. Each marking line 314 can be used to mark a position of an edge of a wafer with a size at the support surface 32. When the wafer with the corresponding size is correctly placed at the support member 31, the marking line 314 can be coincident with the edge of the wafer. The above marking line 314 can be a 2-dimensional mark drawn at the support surface 32 or a 3-dimensional structure arranged at the support surface 32, for example, an arc-shaped groove or a convex platform arranged at the support surface 32.

In some optional embodiments, as shown in FIG. 2A and FIG. 2B, the manipulator further includes a positioning member 4 and a fastener 5. The positioning member 4 is arranged at the finger structure 2 and configured to limit the position of the support member 31 at the finger structure 2. The positioning member 4 can be, for example, a positioning pin. Two ends of the positioning pin can be located in two coaxial positioning holes at the support member 31 and the finger structure 2, respectively. The fastener 5 can be configured to fixedly connect the support member 31 to the finger structure 2. The fastener 5 can be, for example, a fastening screw.

The manipulator of embodiments of the present disclosure can be provided with a plurality of support members arranged at the same circumference on the finger structure at intervals. Each support member can be configured to contact the edge of the wafer to support the wafer. The wafer can be prevented from contacting the finger structure. Since the plurality of support members only contact the edge of the wafer, the support members can be prevented from contacting the surface of the wafer by ensuring the support of the wafer. Thus, the scratches and contact marks generated due to the contact between the manipulator and the surface of the wafer can be avoided. Meanwhile, the plurality of support members can also be configured to prevent the wafer from contacting the finger structure to reduce the scratches generated due to the contact friction with the finger structure due to the curled wafer at a certain degree. Thus, with the manipulator of embodiments of the present disclosure, the impact on the subsequent processes caused by the scratches on the surface of the wafer can be reduced, and the yield of the product can be improved. The manipulator can be applied to the processes of the semiconductor process apparatus that require to protect the surface of the wafer, such as the back metal process.

It can be understood that the above embodiments are only exemplary embodiments used to illustrate the principle of the present disclosure. However, the present disclosure is not limited to this. For those skilled in the art, various modifications and improvements can be made without departing from the spirit and essence of the present disclosure, and these modifications and improvements are also within the protection scope of the present disclosure.

In the description of the present disclosure, it needs to be understood that the orientation or position relationship indicated by the terms "center," "upper," "lower," "front," "rear," "left," "right," "vertical," "horizontal," "top," "bottom," "inner," "outer," etc., can be the orientation or position relationship based on the accompanying drawings, are only used to facilitate the description of the present disclosure and simplifying the description, rather than indicating or implying the indicated devices or elements must have a particular orientation, be constructed and operated in a particular orientation, which cannot be construed as limiting the present disclosure.

The terms "first" and "second" are only used to describe the purposes and cannot be understood as indicating or implying relative importance or implicitly specifying the quantity of indicated technical features. Thus, a feature defined by "first" and "second" can explicitly or implicitly include one or more of these features. In the description of the present disclosure, unless otherwise specified, "plurality" means two or more.

In the description of the present disclosure, it should be noted that unless otherwise specified and limited, the terms "installed," "connected," and "coupled" should be understood in a broad sense. For example, the terms can mean a fixed connection, a detachable connection, or an integral connection; a direct connection, an intermediate connection through an intermediate medium, or an internal communication of two elements. For those skilled in the art, specific meanings of the above terms can be understood according to a specific situation.

In the description of this specification, specific features, structures, materials, or characteristics can be combined in any one or more embodiments or examples in an appropriate manner.

The above descriptions are only some embodiments of the present disclosure. It should be pointed out that those skilled in the art can make some improvements and modifications without departing from the principle of the present disclosure. These improvements and modifications should also be within the protection scope of the present disclosure.

What is claimed is:

1. A manipulator configured to transfer a wafer comprising:
   a finger structure; and
   a plurality of support members arranged at the finger structure and distributed at intervals on a same circumference, each support member being configured to contact an edge of the wafer to support the wafer to prevent the wafer from contacting the finger structure;
   wherein:
   each support member includes a support surface for supporting the wafer;
   the support surface is an inclined surface inclined relative to a horizontal plane;
   each support member includes:
   a support body; and
   an anti-slip flexible member arranged at the support body, the support surface being formed over the anti-slip flexible member;.

2. The manipulator according to claim 1, wherein:
   the inclined surface is a plane and has an angle with the horizontal plane ranging from 1° to 60°.

3. The manipulator according to claim 2, wherein the angle is 5.75°.

4. A manipulator configured to transfer a wafer comprising:
   a finger structure; and
   a plurality of support members arranged at the finger structure and distributed at intervals on a same circumference, each support member being configured to contact an edge of the wafer to support the wafer to prevent the wafer from contacting the finger structure;
   wherein:
   each support member includes a support surface for supporting the wafer;

the support surface is an inclined surface inclined relative to a horizontal plane;

each support member includes:
  a support body including an installation groove; and
  an anti-slip flexible member arranged at the support body, the support surface being formed over the anti-slip flexible member.

5. The manipulator according to claim 4, wherein:
a marking line is provided on the support surface of each supporting member; and
the marking line is used to indicate a position of the edge of the wafer of a size on the support surface.

6. The manipulator according to claim 4, wherein:
the finger structure includes two fingers arranged at an interval in a direction parallel to the horizontal plane; and
the interval between the two fingers is set to prevent the wafer from contacting the fingers.

7. The manipulator according to claim 4, further comprising:
  a positioning member arranged at the finger structure and configured to limit a position of the support member at the finger structure; and
  a fastener configured to fixedly connect the support member to the finger structure.

8. The manipulator according to claim 1, wherein:
a height of the inclined surface relative to the horizontal plane gradually increases in a radial direction of the circumference along a direction away from a center of the circumference.

9. The manipulator according to claim 1, the anti-slip flexible member being annular, and a cross-section shape of the anti-slip flexible member satisfying a point contact between the support surface and the wafer.

10. The manipulator according to claim 1, wherein:
  a marking line is provided on the support surface of each supporting member; and
  the marking line is used to indicate a position of the edge of the wafer of a size on the support surface.

11. The manipulator according to claim 1, wherein:
  the finger structure includes two fingers arranged at an interval in a direction parallel to the horizontal plane; and
  the interval between the two fingers is set to prevent the wafer from contacting the fingers.

12. The manipulator according to claim 1, further comprising:
  a positioning member arranged at the finger structure and configured to limit a position of the support member at the finger structure; and
  a fastener configured to fixedly connect the support member to the finger structure.

13. The manipulator according to claim 4, wherein:
  a height of the inclined surface relative to the horizontal plane gradually increases in a radial direction of the circumference along a direction away from a center of the circumference.

14. The manipulator according to claim 4, the anti-slip flexible member being annular, and a cross-section shape of the anti-slip flexible member satisfying a point contact between the support surface and the wafer.

* * * * *